US012805173B2

(12) United States Patent
Lee et al.

(10) Patent No.: US 12,805,173 B2
(45) Date of Patent: Nov. 17, 2026

(54) DISPLAY DEVICE

(71) Applicant: AUO Corporation, Hsin-Chu (TW)

(72) Inventors: Shu-Hsien Lee, Hsin-Chu (TW); Han-Hung Kuo, Hsin-Chu (TW); Zhi-Jian Yu, Hsin-Chu (TW); Han-Chung Lai, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 355 days.

(21) Appl. No.: 18/536,300

(22) Filed: Dec. 12, 2023

(65) Prior Publication Data

US 2025/0031450 A1 Jan. 23, 2025

(30) Foreign Application Priority Data

Jul. 17, 2023 (TW) ................................ 112126602

(51) Int. Cl.

*H10K 59/70* (2023.01)
*H10K 59/131* (2023.01)
*H10K 59/80* (2023.01)

(52) U.S. Cl.

CPC ....... *H10K 59/8792* (2023.02); *H10K 59/131* (2023.02); *H10K 59/70* (2023.02)

(58) Field of Classification Search

CPC .... H10D 86/60; H10D 86/451; H10D 86/441; H10D 86/40; H10D 86/481; H10W 90/00; H10H 29/142; H10K 59/123; H10K 59/126; H10K 59/131; H10K 59/179; H10K 59/70; H10K 59/805; H10K 59/8051; H10K 59/80515; H10K 59/8052; H10K 59/80521; H10K 59/82; H10K 59/84; H10K 59/86

See application file for complete search history.

(56) References Cited

U.S. PATENT DOCUMENTS

| | | | | |
|---|---|---|---|---|
| 12,063,816 | B2 * | 8/2024 | Kim | H10K 59/122 |
| 2007/0257254 | A1 * | 11/2007 | Yang | H10K 59/13 257/40 |
| 2017/0012086 | A1 * | 1/2017 | Kim | H10K 71/70 |
| 2017/0256597 | A1 * | 9/2017 | Lee | H10K 59/873 |
| 2018/0011385 | A1 * | 1/2018 | Kang | H10K 59/879 |
| 2019/0288046 | A1 * | 9/2019 | Park | H10K 59/124 |

(Continued)

FOREIGN PATENT DOCUMENTS

| | | |
|---|---|---|
| CN | 109994041 B | 8/2021 |
| CN | 217037556 U | 7/2022 |

*Primary Examiner* — Eduardo A Rodela

(74) *Attorney, Agent, or Firm* — WPAT, PC

(57) ABSTRACT

A display device includes a substrate, a switching element, a first insulating layer, a first metal layer, and an energy-absorbing layer. The switching element is on the substrate and has a source/drain. The first insulating layer covers the switching element and has a first opening. The first metal layer is on the first insulating layer and extends through the first opening. The energy-absorbing layer is over the first metal layer. A first orthographic projection area of the first opening projected on the substrate is within a second orthographic projection area of the energy-absorbing layer projected on the substrate. A laser reflectivity of a material of the energy-absorbing layer is higher than a laser reflectivity of a material of the source/drain. A laser absorptivity of the material of the energy-absorbing layer is lower than a laser absorptivity of the material of the source/drain.

5 Claims, 8 Drawing Sheets

(56) References Cited

U.S. PATENT DOCUMENTS

| | | | | |
|---|---|---|---|---|
| 2020/0194509 | A1* | 6/2020 | Beak | H10K 59/80515 |
| 2021/0126077 | A1* | 4/2021 | Chae | H10K 59/121 |
| 2021/0193769 | A1* | 6/2021 | Bok | H10W 90/00 |
| 2021/0210584 | A1* | 7/2021 | Youn | H10K 59/88 |
| 2022/0115572 | A1 | 4/2022 | Yang et al. | |
| 2022/0393075 | A1* | 12/2022 | Li | H10H 20/841 |
| 2024/0014350 | A1* | 1/2024 | Cho | H10H 20/8312 |
| 2024/0162397 | A1* | 5/2024 | Lee | H10H 20/855 |
| 2024/0324323 | A1* | 9/2024 | Choi | H10K 59/124 |

* cited by examiner

10

20

DISPLAY DEVICE

CROSS-REFERENCE TO RELATED APPLICATION

This application claims priority to Taiwan Application Serial Number 112126602, filed Jul. 17, 2023, which is herein incorporated by reference.

BACKGROUND

Technical Field

The present disclosure relates to a display device.

Description of Related Art

In recent years, display devices have been widely applied in electronic devices such as mobile phones, smartphones, televisions, monitors, tablets, automotive display devices, wearable devices, and desktop computers. Therefore, how to improve the display quality of display devices has been brought into focus.

For example, in the manufacturing process of display devices, laser heating is usually performed to bond light-emitting elements to metal pads after mass transfer. However, certain portions of the conductive structures in the display devices may be overheated during the laser heating process, resulting in cracks, disconnections, and defects. As a result, dark dot defects appear in the display area of the display devices, reducing their display quality.

Accordingly, how to provide a display device to solve the aforementioned problems becomes an important issue to be solved by those in the industry.

SUMMARY

An aspect of the disclosure is to provide a display device that may efficiently solve the aforementioned problems.

According to an embodiment of the disclosure, a display device includes a substrate, a switching element, a first insulating layer, a first metal layer, a second insulating layer, an energy-absorbing layer, and a light-emitting element. The switching element is disposed on the substrate and has a source/drain. The first insulating layer covers the switching element and has a first opening. The first metal layer is disposed on the first insulating layer. A part of the first metal layer extends downward through the first opening. The part of the first metal layer is electrically connected to the source/drain of the switching element. The part of the first metal layer contacts an upper surface of the source/drain. The second insulating layer covers the first metal layer. The energy-absorbing layer is disposed on the second insulating layer. A first orthographic projection area of the first opening projected on the substrate is within a second orthographic projection area of the energy-absorbing layer projected on the substrate. A reflectivity of a material of the energy-absorbing layer with respect to a laser is higher than a reflectivity of a material of the source/drain with respect to the laser. An absorptivity of the material of the energy-absorbing layer with respect to the laser is lower than an absorptivity of the material of the source/drain with respect to the laser. The light-emitting element is electrically connected to the first metal layer.

According to another embodiment of the disclosure, a display device includes a substrate, a first switching element, a second switching element, a first insulating layer, a second insulating layer, a first metal layer, a second metal layer, a first metal pad, a second metal pad, a first light-emitting element, and a second light-emitting element. The first switching element is disposed on the substrate and has a source/drain. The second switching element is disposed on the substrate and has a source/drain. The first insulating layer covers the first switching element and the second switching element. The first insulating layer has a first opening and a second opening. The second insulating layer is disposed over the first insulating layer. The first metal layer is disposed in the second insulating layer. A part of the first metal layer extends downward through the first opening. The part of the first metal layer is connected to the source/drain of the first switching element. The second metal layer is disposed in the second insulating layer. A part of the second metal layer extends downward through the second opening. The part of the second metal layer is electrically connected to the source/drain of the second switching element. The first metal pad is disposed on the second insulating layer. A first orthographic projection area of the first opening projected on the substrate is within a second orthographic projection area of the first metal pad projected on the substrate. The second metal pad is disposed on the second insulating layer. A third orthographic projection area of the second opening projected on the substrate is within a fourth orthographic projection area of the second metal pad projected on the substrate. An absorptivity of a material of the first metal pad and the second metal pad with respect to a laser is lower than an absorptivity of a material of the source/drain of the first switching element and the source/drain of the second switching element with respect to the laser. The first light-emitting element and a second light-emitting element are electrically connected to the first metal layer and the second metal layer, respectively.

According to yet another embodiment of the disclosure, a display device includes a substrate, a first switching element, a second switching element, a first insulating layer, a second insulating layer, a first metal layer, a second metal layer, a first energy-absorbing layer, a second energy-absorbing layer, a first metal pad, a second metal pad, a first light-emitting element, and a second light-emitting element. The first switching element is disposed on the substrate and has a source/drain. The second switching element is disposed on the substrate and has a source/drain. The first insulating layer covers the first switching element and the second switching element. The first insulating layer has a first opening and a second opening. The second insulating layer is disposed over the first insulating layer. The first metal layer is disposed in the second insulating layer. A part of the first metal layer extends downward through the first opening. The part of the first metal layer is electrically connected to the source/drain of the first switching element. The second metal layer is disposed in the second insulating layer. A part of the second metal layer extends downward through the second opening. The part of the second metal layer is electrically connected to the source/drain of the second switching element. The first energy-absorbing layer is disposed on the second insulating layer. A first orthographic projection area of the first opening projected on the substrate is within a second orthographic projection area of the first energy-absorbing layer projected on the substrate. The second energy-absorbing layer is disposed on the second insulating layer. A third orthographic projection area of the second opening projected on the substrate is within a fourth orthographic projection area of the second energy-absorbing layer projected on the substrate. A reflectivity of a material of the first energy-absorbing layer and the second energy-absorbing layer with respect to a laser is higher than a reflectivity of a material of the source/drain of the first switching element and the source/drain of the second switching element with respect to the laser. An absorptivity of the material of the first energy-absorbing layer and the second energy-absorbing layer with respect to the laser is lower than an absorptivity of the material of the source/drain of the first switching element and the source/drain of the second switching element with respect to the laser. The first metal pad and the second metal pad are in contact with the first metal layer and the second metal layer, respectively. The first light-emitting element and a second light-emitting element are electrically connected to the first metal pad and the second metal pad, respectively.

Accordingly, in the display devices of some embodiments of the present disclosure, for portions of the conductive structures in the display devices that may be overheated due to the laser heating processes, layers with lower absorptivity with respect to the laser are disposed along laser beam paths to cover the portions of the conductive structures. At the same time, the layers with lower absorptivity may act as energy-absorbing layers to block and absorb the laser energy, thereby reducing the impact of heat conduction on the conductive structures. Furthermore, depending on the manufacturing process, the layers with lower absorptivity can comprise metallic materials or non-metallic materials. The absorptivity of the selected material with respect to the laser at a specific wavelength is lower than the absorptivity of the material of the conductive structures with respect to the laser at the same wavelength. In addition, the layers with lower absorptivity are disposed so that an orthographic projection area of the portions of the conductive structures susceptible to the laser heating processes projected on the substrate is within an orthographic projection area of the layers with lower absorptivity projected on the substrate. Compared with commonly used display devices, dark dot defects can be reduced, and the quality can be improved in the display devices of some embodiments of the present disclosure.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
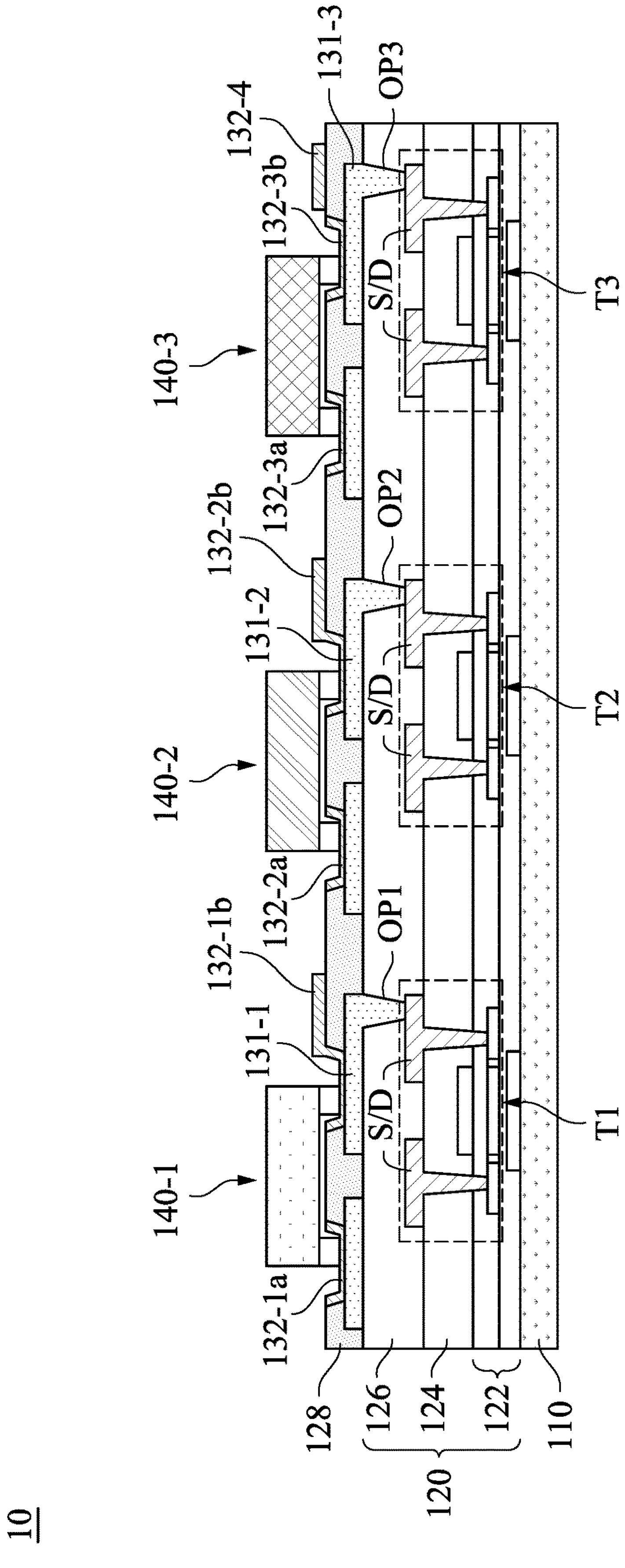
FIG. 1 is a partial cross-sectional view of a display device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

Reference is made to FIG. 1. FIG. 1 is a partial cross-sectional view of a display device 10 according to some embodiments of the present disclosure. As shown in FIG. 1, the display device 10 includes a substrate 110, a switching element T1, a switching element T2, and a switching element T3. As shown in FIG. 1, the switching element T1, the switching element T2, and the switching element T3 are disposed on the substrate 110. In some embodiments, the substrate 110 is a glass substrate. In some embodiments, the switching element T1, the switching element T2, and the switching element T3 are thin film transistors (TFTs) and include a source/drain S/D and a gate, respectively.

As shown in FIG. 1, the display device 10 further includes a first insulating layer 120 and a second insulating layer 128. The first insulating layer 120 covers the switching element T1, the switching element T2, and the switching element T3. As shown in FIG. 1, the second insulating layer 128 is disposed over the first insulating layer 120.

As shown in FIG. 1, the first insulating layer 120 has a first opening OP1, a first opening OP2, and a first opening OP3. In some embodiments, the first insulating layer 120 may be further divided into a gate insulating layer 122 (GI), an interlayer dielectric 124 (ILD), and a planarization layer 126. As shown in FIG. 1, the planarization layer 126 has a first opening OP1, a first opening OP2, and a first opening OP3.

As shown in FIG. 1, the display device 10 further includes a light-emitting element 140-1, a light-emitting element 140-2, and a light-emitting element 140-3. The light-emitting element 140-1, the light-emitting element 140-2, and the light-emitting element 140-3 are electrically connected to the switching element T1, the switching element T2, and the switching element T3, respectively. In some embodiments, the light-emitting element 140-1, the light-emitting element 140-2, and the light-emitting element 140-3 are light-emitting diodes (LEDs). In some embodiments, the light-emitting element 140-1, the light-emitting element 140-2, and the light-emitting element 140-3 are disposed in an upside-down (flip chip) manner, but the present disclosure is not limited thereto.

To establish an electrical connection between the light-emitting element and the switching element, the display device 10 further includes a conductive structure. The conductive structure includes metal lines, conductive vias, and bonding pads. For convenience, in the following paragraphs, the metal lines and conductive vias are referred to as metal layers and are represented as one element with the same numeral in the drawings.

For example, as shown in FIG. 1, the conductive structure includes a first metal layer 131-1, a first metal layer 131-2, and a first metal layer 131-3 disposed on the first insulating layer 120. Specifically, the first metal layer 131-1, the first metal layer 131-2, and the first metal layer 131-3 are disposed on the upper surface of the planarization layer 126 and covered by the second insulating layer 128. In other words, the first metal layer 131-1, the first metal layer 131-2, and the first metal layer 131-3 are disposed in the first insulating layer 120 and the second insulating layer 128. As shown in FIG. 1, the first metal layer 131-1 has a part extending downward through the first opening OP1. Similarly, the first metal layer 131-2 has a part extending downward through the first opening OP2, and the first metal layer 131-3 has a part extending downward through the first opening OP3.

As shown in FIG. 1, the first metal layer 131-1 contacts the upper surface of the source/drain S/D of the switching element T1 through the first opening OP1 and establishes an electrical connection. Similarly, the first metal layer 131-2 contacts the upper surface of the source/drain S/D of the switching element T2 through the first opening OP2 and establishes an electrical connection. The first metal layer 131-3 contacts the upper surface of the source/drain S/D of the switching element T3 through the first opening OP3 and establishes an electrical connection.

As aforementioned, the conductive structure further includes metal pads. As shown in FIG. 1, the second insulating layer 128 has a plurality of second openings. A metal pad 132-1*a*, a metal pad 132-1*b*, a metal pad 132-2*a*, a metal pad 132-2*b*, a metal pad 132-3*a*, and a metal pad 132-3*b* are disposed in the plurality of second openings and act as contact pads of the light-emitting elements. As shown in FIG. 1, the metal pad 132-1*a* and the metal pad 132-1*b* are disposed between the light-emitting element 140-1 and the first metal layer 131-1. The metal pad 132-2*a* and the metal pad 132-2*b* are disposed between the light-emitting element 140-2 and the first metal layer 131-2. The metal pad 132-3*a* and the metal pad 132-3*b* are disposed between the light-emitting element 140-3 and the first metal layer 131-3. The light-emitting element 140-1 is connected to the source/drain S/D of the switching element T1 through the metal pad 132-1*a* and the metal pad 132-1*b*. The light-emitting element 140-2 is connected to the source/drain S/D of the switching element T2 through the metal pad 132-2*a* and the metal pad 132-2*b*. The light-emitting element 140-3 is connected to the source/drain S/D of the switching element T3 through the metal pad 132-3*a* and the metal pad 132-3*b*.

In the manufacturing process of display devices, after the light-emitting elements are mass transferred to the expected bonding area, a laser heating process is usually performed to heat the intermediate display device indiscriminately over a large area, so that the light-emitting elements can be bonded to the metal pads. However, in the structure of the display device 10, the contact surface between the first metal layer and the source/drain S/D of the switching element may be overheated during the laser heating process. For example, the contact surface may be a contact surface between the first metal layer 131-1 and the switching element T1, a contact surface between the first metal layer 131-2 and the switching element T2, or a contact surface between the first metal layer 131-3 and the switching element T3. Therefore, cracks, disconnections, and dark spot defects may appear on the contact surfaces in the display area of the display device, reducing the display quality.

Therefore, in some embodiments of the present disclosure, as shown in FIG. 1, the metal pad 132-1*b* extends out of the second opening of the second insulating layer 128 and covers the upper surface of the second insulating layer 128 such that the orthographic projection area of the first opening OP1 projected on the substrate 110 is within the orthographic projection area of the metal pad 132-1*b* projected on the substrate 110. To be more specific, a part of the first metal layer 131-1 extends downward through the first opening OP1 and contacts the source/drain S/D of the switching element T1 at a contact surface. The orthographic projection area of the contact surface projected on the substrate 110 is within the orthographic projection area of the metal pad 132-1*b* projected on the substrate 110. In other words, during the laser heating process, the metal pad 132-1*b* can cover the part of the first metal layer 131-1 that extends downward through the first opening OP1. At the same time, the metal pad 132-1*b* can act as an energy-absorbing layer to block and absorb the laser energy to reduce the impact of heat conduction on the contact surface between the first metal layer 131-1 and the source/drain S/D of the switching element T1.

In some embodiments, in order to enable the metal pad 132-1*b* to effectively block the laser energy, the material of the metal pad 132-1*b* is selected to have a lower absorptivity with respect to the laser at a specific wavelength than the source/drain S/D of the switching element T1.

For example, in some embodiments, a laser at a wavelength of about 450 nm is used for the laser heating process. The material of the source/drain S/D of the switching element T1 includes nickel (Ni). The absorptivity of nickel with respect to the laser at a wavelength of about 450 nm is about 65%. Therefore, the material of the metal pad 132-1*b* may be copper (Cu), which has an absorptivity of about 51% with respect to the laser at a wavelength of about 450 nm.

For example, in some embodiments, a laser at a wavelength of about 1064 nm is used for the laser heating process. The material of the source/drain S/D of the switching element T1 includes copper. The absorptivity of copper with respect to the laser at a wavelength of about 1064 nm is about 37%. Therefore, the material of the metal pad 132-1*b* may be aluminum (Al), for aluminum has an absorptivity of about 13% with respect to the laser at a wavelength of about 1064 nm.

In some embodiments, the material of the source/drain S/D of the switching element T1 includes molybdenum (Mo), aluminum, titanium (Ti), copper, indium (In), or the like. In some embodiments, the material of the metal pad 132-1*b* includes aluminum, copper, silver (As), gold (Au), nickel, or alloys thereof.

In most cases, materials with a low absorptivity also have a high reflectivity. In other words, in some embodiments, the material of the metal pad 132-1*b* has a lower absorptivity and a higher reflectivity with respect to a laser at a specific wavelength compared to the material of the source/drain S/D of the switching element T1.

Similarly, the configurations and applicable materials of the metal pad 132-2*b* and the source/drain S/D of the switching element T2 are the same as those of the metal pad 132-1*b* and the source/drain S/D of the switching element T1.

Furthermore, in some embodiments of the present disclosure, as shown in FIG. 1, the metal pad 132-3*b* does not extend out of the second opening of the second insulating layer 128. In addition, the display device 10 further includes a metal pad 132-4. The metal pad 132-4 is disposed on the second insulating layer 128 and is separated from the metal pad 132-3*b* so that the orthographic projection area of the first opening OP3 projected on the substrate 110 is within the orthographic projection area of the metal pad 132-4 projected on the substrate 110. In other words, during the laser heating process, the metal pad 132-4 is disposed on the laser beam path toward the first opening OP3 and acts as an energy-absorbing layer to block and absorb the laser energy. In this way, the part of the first metal layer 131-3 that is in the first opening OP3 and extends downward may be prevented from laser irradiation. Similarly, in order for the metal pad 132-4 to effectively block the laser, the material of the metal pad 132-4 is selected to have a low absorptivity and a high reflectivity with respect to the laser at a specific wavelength compared to the material of the source/drain S/D of the switching element T3. In some embodiments, the metal pad 132-4 and the metal pad 132-3*b* include the same material.

Figure 2:
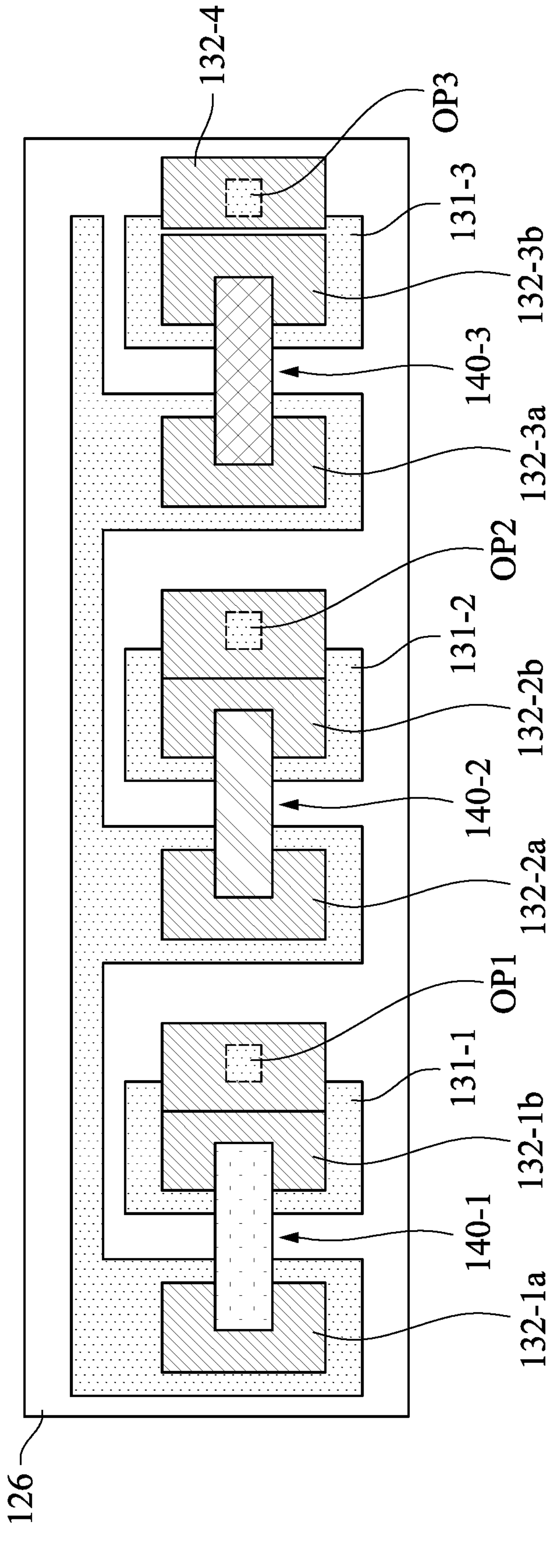
FIG. 2 is a top view of a display device according to some embodiments of the present disclosure.

Reference is made to FIG. 2. FIG. 2 is a top view of the display device 10 according to some embodiments of the present disclosure. It should be noted that the second insulating layer 128 is not shown in FIG. 2 and subsequent top views for clarity. The positions of the metal pad 132-1*a*, the metal pad 132-1*b*, the metal pad 132-2*a*, the metal pad 132-2*b*, the metal pad 132-3*a*, and the metal pad 132-3*b* are shown in FIG. 2. In the process of forming the metal pads, a metal layer may be deposited in a single deposition process to cover the second insulating layer 128. Then, part of the metal layer may be removed in accordance with the positions and number of the metal pads.

It should be understood that the display device may only include periodically arranged metal pads 132-1*a* and metal pads 132-1*b*, periodically arranged metal pads 132-2*a* and metal pads 132-2*b*, or periodically arranged metal pads 132-3*a* and metal pads 132-3*b* without departing from the scope of this disclosure.

Figure 3:
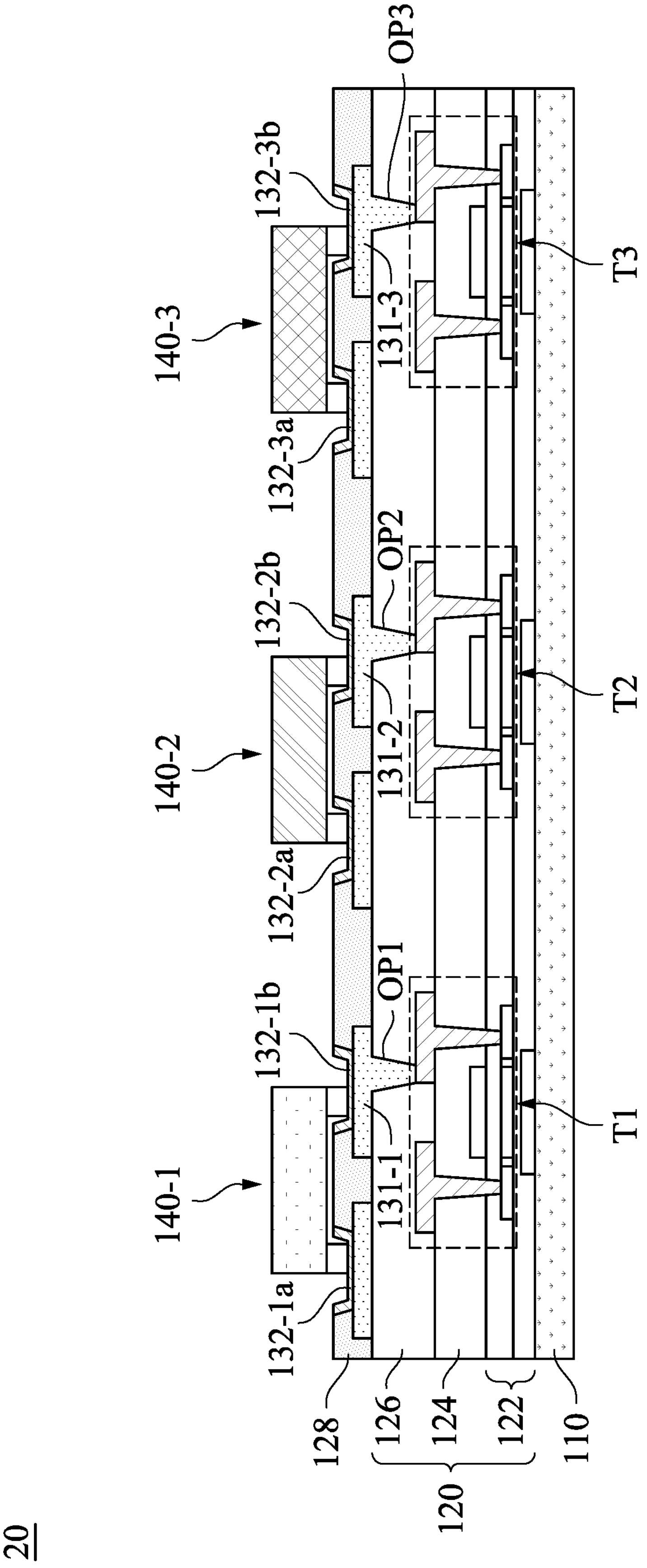
FIG. 3 is a partial cross-sectional view of a display device according to some embodiments of the present disclosure.
Figure 4:
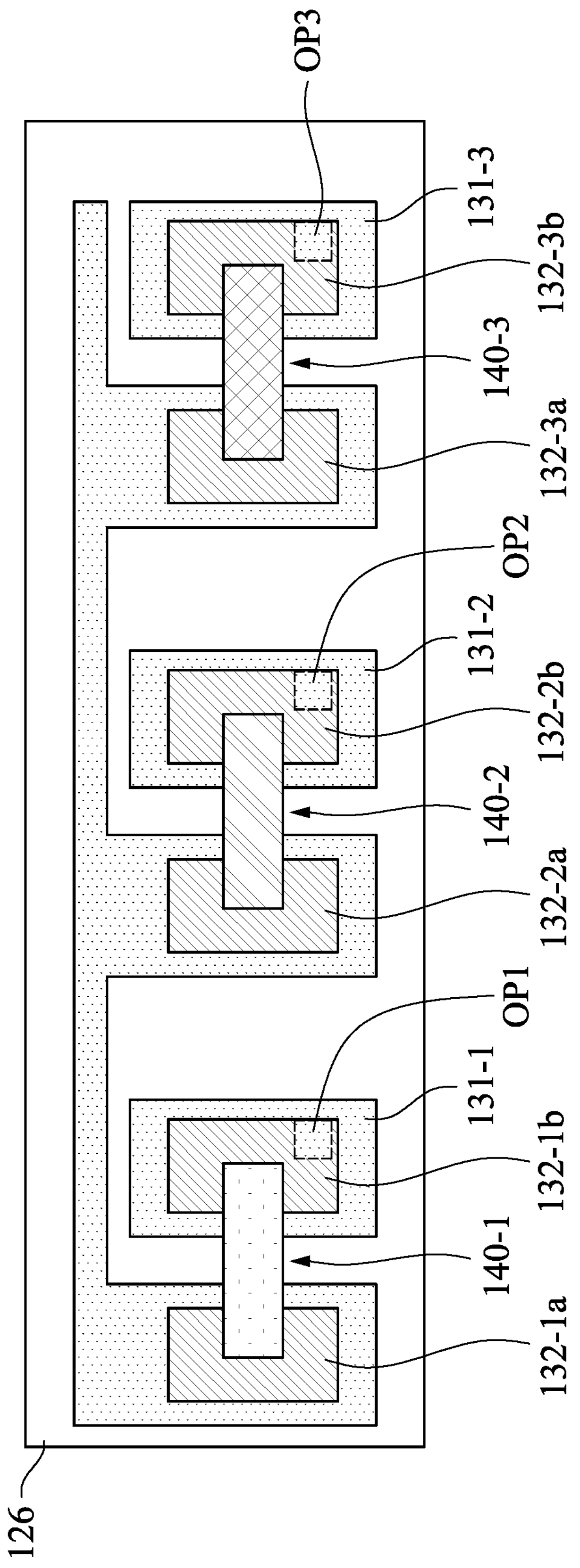
FIG. 4 is a top view of a display device according to some embodiments of the present disclosure.

Reference is made to FIG. 3 and FIG. 4. FIG. 3 is a partial cross-sectional view of a display device 20 according to some embodiments of the present disclosure. FIG. 4 is a top view of the display device 20 according to some embodiments of the present disclosure. One of the differences between the display device 20 and the display device 10 is that, as shown in FIG. 3, the display device 20 does not include the metal pad 132-4. In addition, the metal pad 132-1*b*, the metal pad 132-2*b*, and the metal pad 132-3*b* of the display device 20 do not extend out of the second openings of the second insulating layer 128. Moreover, the orthographic projection areas of the first opening OP1, the first opening OP2, and the first opening OP3 projected on the substrate 110 are within the orthographic projection areas of the metal pad 132-1*b*, the metal pad 132-1*b*, and the metal pad 132-1*b*, respectively.

To be more specific, in the embodiment of the display device 20, the part of the first metal layer extending downward is disposed closer to the light-emitting element compared to the part of the first metal layer of the display device 10, so that the orthographic projection area of the first opening is within the orthographic projection area of the second opening accommodating the corresponding metal pad. In this way, the metal pad can block the laser energy along the laser beam path of the first opening and serve as an energy-absorbing layer without extending out of the second opening. For example, as shown in FIG. 3 and FIG. 4, the part of the first metal layer 131-1 of the display device 20 is disposed closer to the light-emitting element 140-1 compared to the part of the first metal layer 131-1 of the display device 10, so that the orthographic projection area of the first opening OP1 is within the orthographic projection area of the second opening accommodating the metal pad 132-1*b*.

Figure 5:
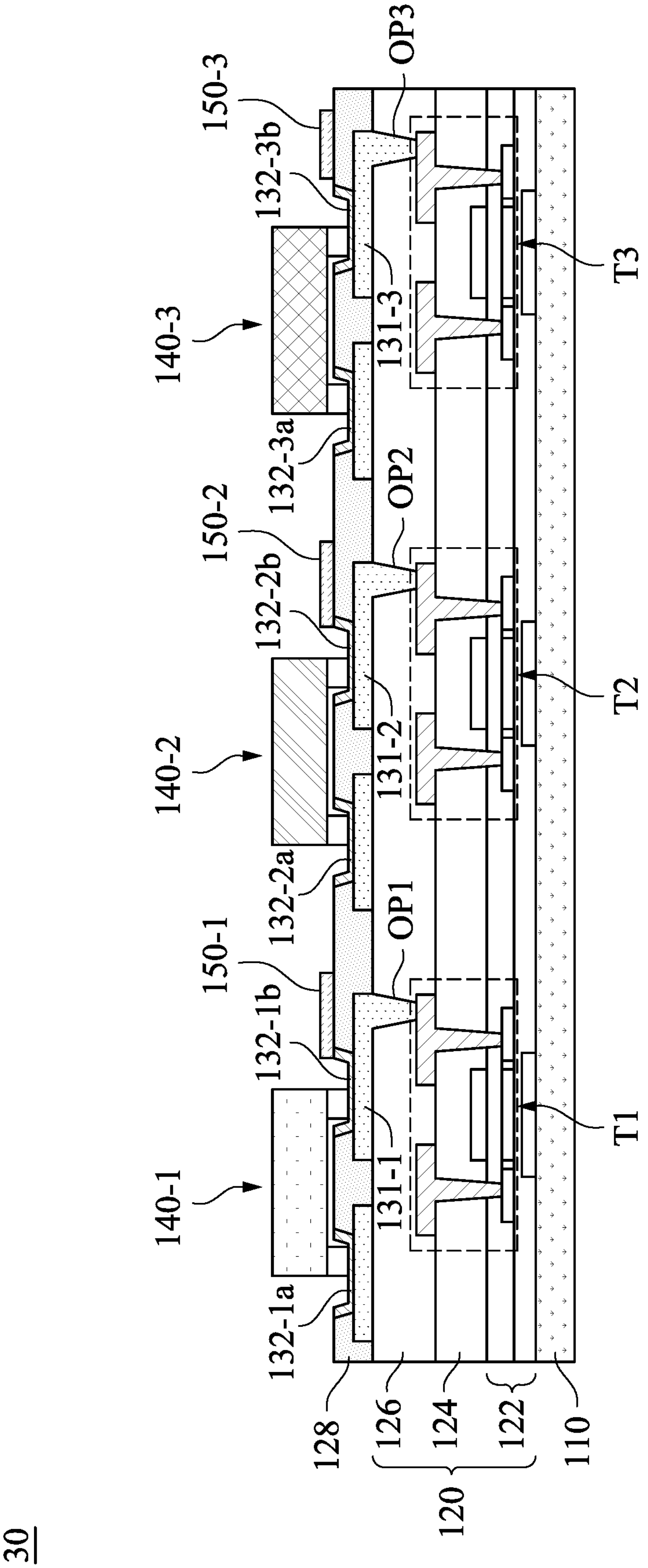
FIG. 5 is a partial cross-sectional view of a display device according to some embodiments of the present disclosure.
Figure 6:
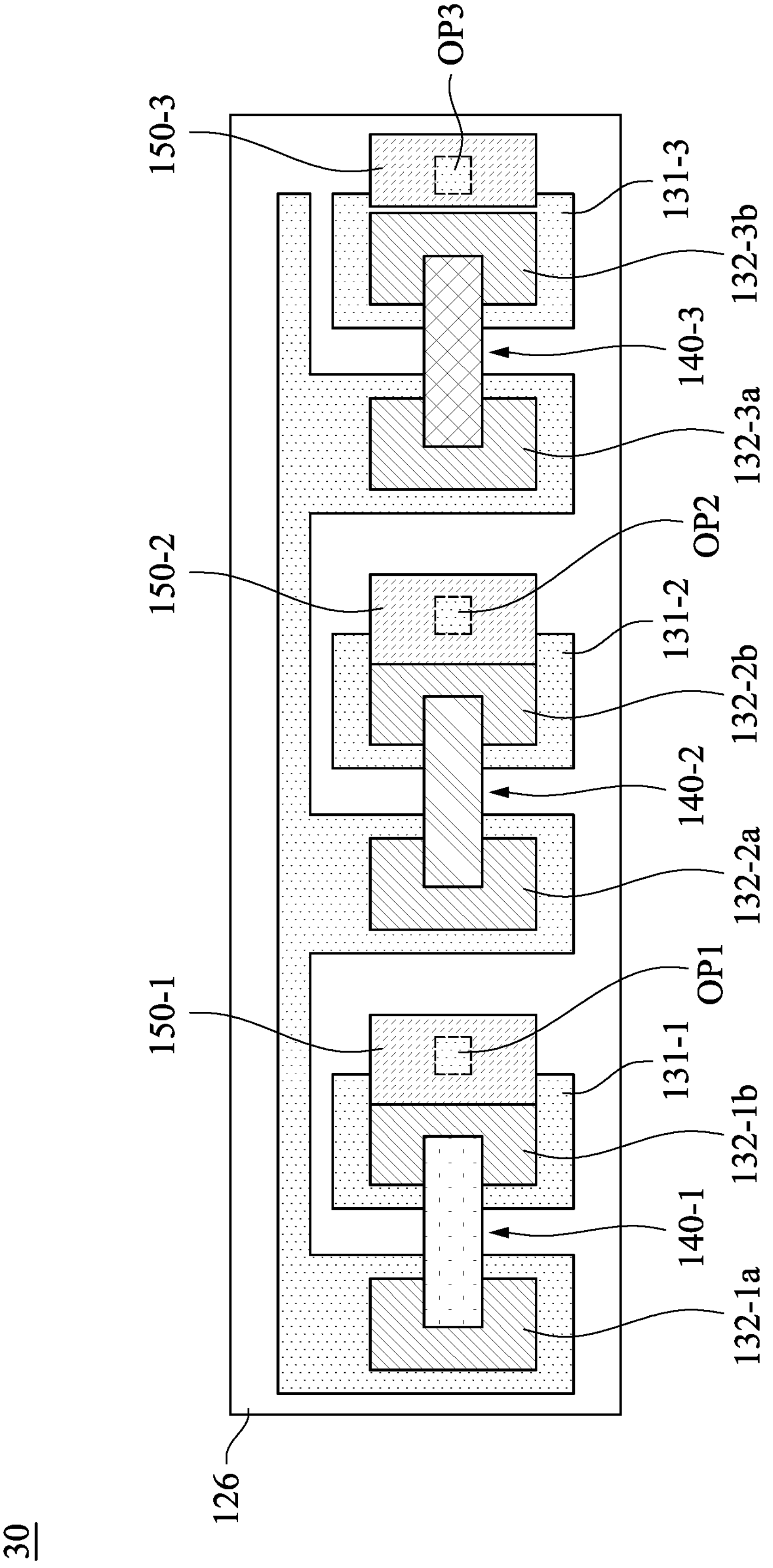
FIG. 6 is a top view of a display device according to some embodiments of the present disclosure.

Reference is made to FIG. 5 and FIG. 6. FIG. 5 is a partial cross-sectional view of a display device 30 according to some embodiments of the present disclosure. FIG. 6 is a top view of the display device 30 according to some embodiments of the present disclosure. One of the differences between the display device 30 and the display device 10 is that in some embodiments, as shown in FIG. 5, the metal pad 132-1*b*, the metal pad 132-2*b*, and the metal pad 132-3*b* of the display device 30 do not extend outside the second openings of the second insulating layer 128. Also, the display device 30 further includes an energy-absorbing layer 150-1, an energy-absorbing layer 150-2, and an energy-absorbing layer 150-3. The energy-absorbing layer 150-1, the energy-absorbing layer 150-2, and the energy-absorbing layer 150-3 are disposed on the second insulating layer 128, so that the orthographic projection areas of the first opening OP1, the first opening OP2, and the first opening OP3 projected on the substrate 110 are within the orthographic projection areas of the energy-absorbing layer 150-1, the energy-absorbing layer 150-2, and the energy-absorbing layer 150-3, respectively.

In some embodiments, the energy-absorbing layer 150-1, the energy-absorbing layer 150-2, and the energy-absorbing layer 150-3 include different materials from the metal pad 132-1*b*, the metal pad 132-2*b*, and the metal pad 132-3*b*.

In some embodiments, the material of the energy-absorbing layer 150-1, the energy-absorbing layer 150-2, and the energy-absorbing layer 150-3 is metallic and conductive. Similar to the aforementioned, in order to effectively block lasers, the energy-absorbing layer is selected to have lower absorptivity with respect to the laser at a specific wavelength. To be more specific, the absorptivity of the energy-absorbing layer is lower than that of the first metal layer and that of the source/drain S/D of the switching element. For example, the absorptivity of the energy-absorbing layer 150-1 is lower than the absorptivity of the first metal layer 131-1 and the source/drain S/D of the switching element T1. In some embodiments, the material of the energy-absorbing layer 150-1, the energy-absorbing layer 150-2, and the energy-absorbing layer 150-3 may include aluminum, copper, silver, gold, nickel, or alloys thereof.

Since the material of the energy-absorbing layer 150-1, the energy-absorbing layer 150-2, and the energy-absorbing layer 150-3 of the display device 30 is different from the material of the metal pad 132-1*b*, the metal pad 132-2*b*, and the metal pad 132-3*b*, the energy-absorbing layer 150-1, the energy-absorbing layer 150-2, and the energy-absorbing layer 150-3 are formed through additional metal deposition and removal processes after the metal pad 132-1*b*, the metal pad 132-2*b*, and the metal pad 132-3*b* are formed.

To prevent metallic materials from causing short circuits between metal pads of different light-emitting elements, the energy-absorbing layers are disposed to be separated from the metal pads or each of the contact absorbing layers contacts one single metal pad. For example, as shown in FIG. 5, the energy-absorbing layer 150-1 is in contact with the metal pad 132-1*b* and separated from the metal pad 132-2*a*. Similarly, the energy-absorbing layer 150-2 is in contact with the metal pad 132-2*b* and separated from the metal pad 132-3*a*. In contrast, the energy-absorbing layer 150-3 is separated from the metal pad 132-3*b*.

In some embodiments, the material of the energy-absorbing layer 150-1, the energy-absorbing layer 150-2, and the energy-absorbing layer 150-3 is non-metallic. In some embodiments, the material of the energy-absorbing layer 150-1, the energy-absorbing layer 150-2, and the energy-absorbing layer 150-3 is an insulating material. As aforementioned, in order to effectively block lasers, the energy-absorbing layer includes materials with lower absorptivity with respect to the lasers. For example, in some embodiments, the material of the energy-absorbing layer 150-1, the energy-absorbing layer 150-2, and the energy-absorbing layer 150-3 includes silicon carbide (SiC), aluminum nitride (AlN), aluminum silicate, boron nitride (BN), or the like.

Similar to the aforementioned, the energy-absorbing layer including the non-metallic material is formed through additional deposition and removal processes. In some embodiments, the energy-absorbing layers are in contact with the metal pads. For example, as shown with the energy-absorbing layer 150-1 and the energy-absorbing layer 150-2 in FIG. 5. In some embodiments, the energy-absorbing layer is separated from the metal pads. For example, as shown with the energy-absorbing layer 150-3 in FIG. 5.

Figure 7:
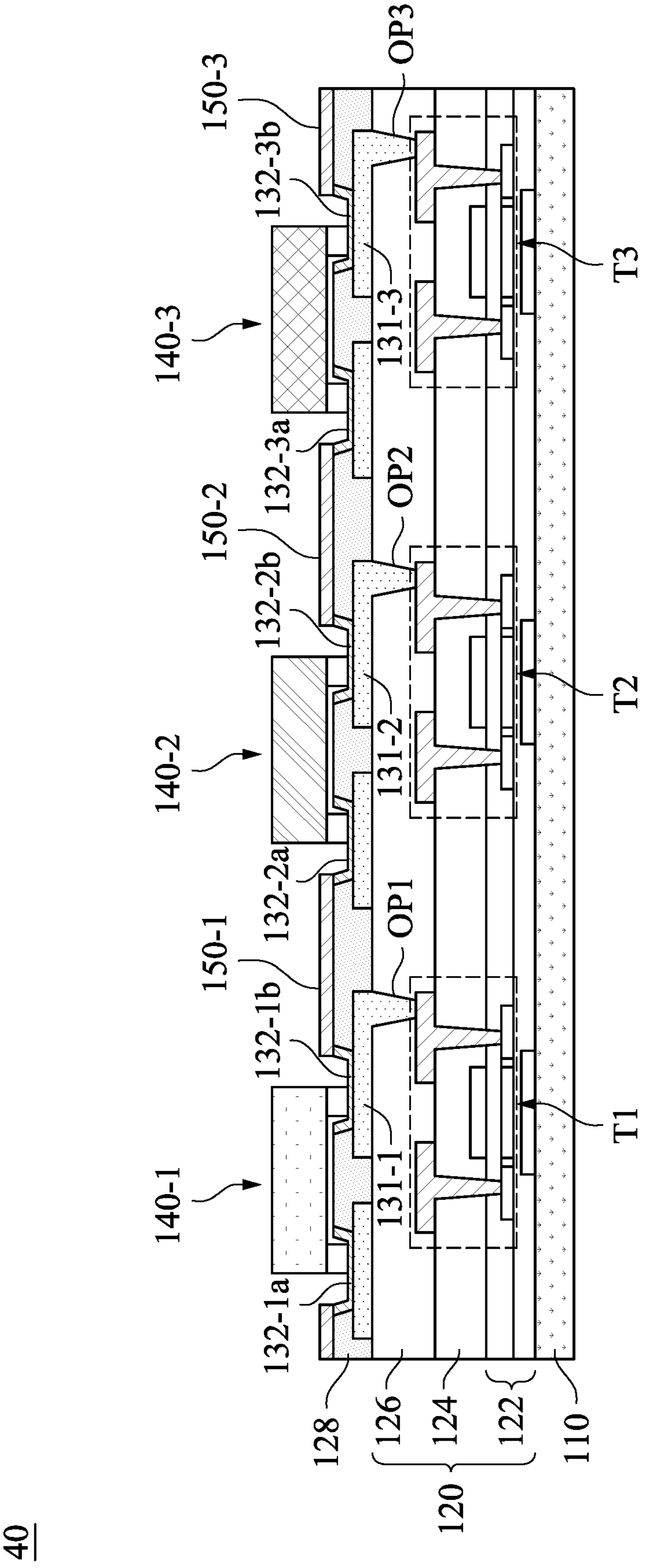
FIG. 7 is a partial cross-sectional view of a display device according to some embodiments of the present disclosure.
Figure 8:
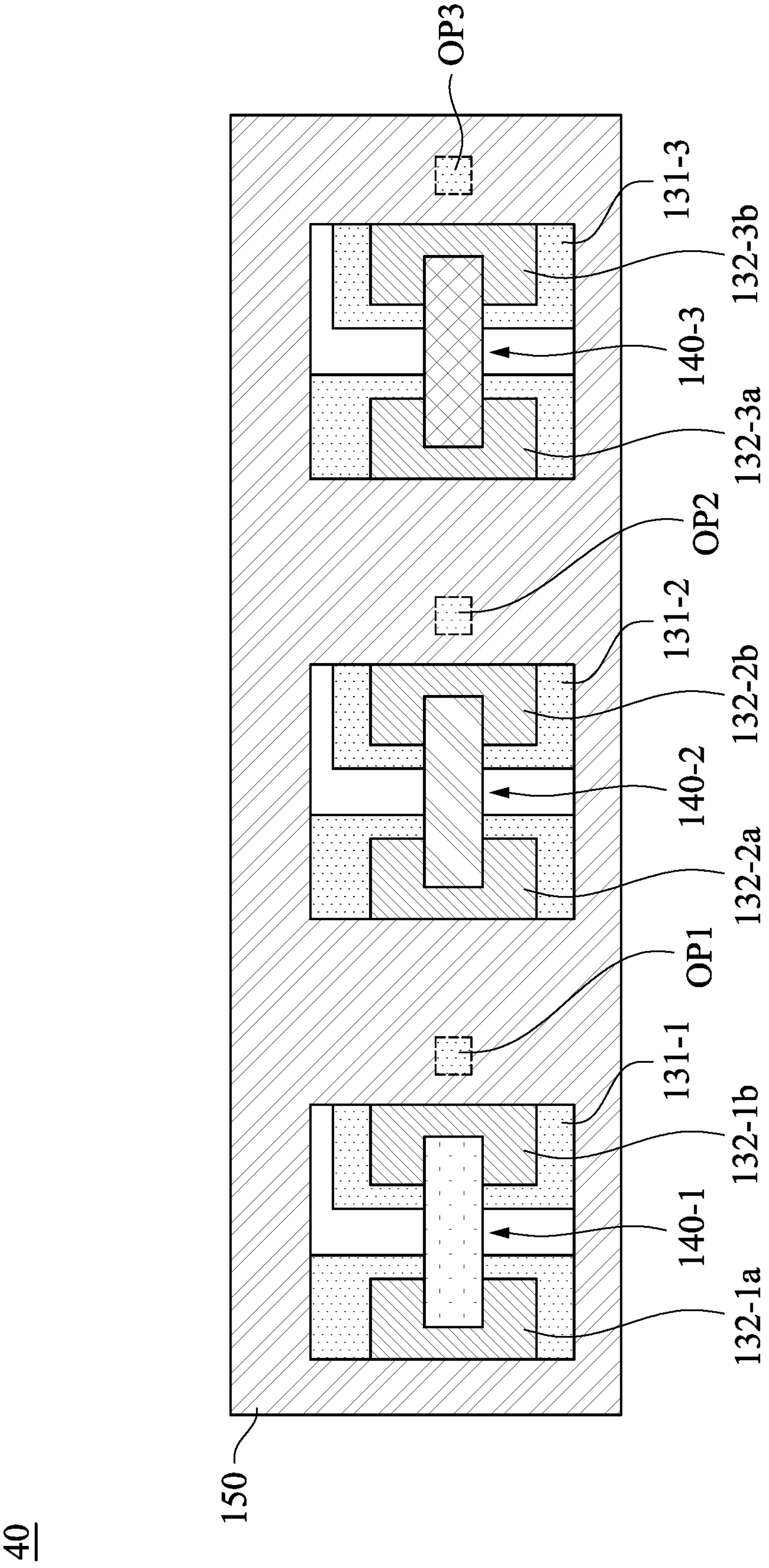
FIG. 8 is a top view of a display device according to some embodiments of the present disclosure.

It should be noted that when the material of the energy-absorbing layer is an insulating non-metallic material, the energy-absorbing layer can be in contact with several metal pads without causing short circuits between the metal pads of different light-emitting elements. Therefore, in some embodiments, a non-metallic material layer may be deposited to cover the second insulating layer 128. Then, only portions of the non-metallic material layer deposited on the metal pads are removed, so that the metal pads are exposed through the non-metallic material layer for bonding the light-emitting elements in the following processes. For example, reference is made to FIG. 7 and FIG. 8. FIG. 7 is a partial cross-sectional view of a display device 40 according to some embodiments of the present disclosure. FIG. 8 is a top view of the display device 40 according to some embodiments of the present disclosure.

As shown in FIG. 7, the energy-absorbing layer 150-1 contacts the metal pad **132-1*b* and the metal pad 132-2*a*. The energy-absorbing layer 150-2 contacts the metal pad 132-2*b* and the metal pad 132-3*a*. As shown in FIG. 7 and FIG. 8, the energy-absorbing layer 150-1, the energy-absorbing layer 150-2, and the energy-absorbing layer 150-3 are formed into a continuous energy-absorbing layer 150. In addition, in some embodiments, the selected non-metallic material for the energy-absorbing layer has low light transmittance, so the energy-absorbing layer 150 can also act as a light-shielding layer to increase the contrast of the display device 40**.

According to the foregoing recitations of the embodiments of the disclosure, it may be seen that in the display devices of some embodiments of the present disclosure, for portions of the conductive structures in the display devices that may be overheated due to the laser heating processes, layers with lower absorptivity with respect to the laser are disposed along laser beam paths to cover the portions of the conductive structures. At the same time, the layers with lower absorptivity may act as energy-absorbing layers to block and absorb the laser energy, thereby reducing the impact of heat conduction on the conductive structures. Furthermore, depending on the manufacturing process, the layers with lower absorptivity can comprise metallic materials or non-metallic materials. The absorptivity of the selected material with respect to the laser at a specific wavelength is lower than the absorptivity of the material of the conductive structures with respect to the laser at the same wavelength. In addition, the layers with lower absorptivity are disposed so that an orthographic projection area of the portions of the conductive structures susceptible to the laser heating processes projected on the substrate is within an orthographic projection area of the layers with lower absorptivity projected on the substrate. Compared with commonly used display devices, dark dot defects can be reduced, and the quality can be improved in the display devices of some embodiments of the present disclosure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A display device, comprising:

a substrate;

a first switching element disposed on the substrate and having a source/drain electrode;

a second switching element disposed on the substrate and having a source/drain electrode;

a first insulating layer covering the first switching element and the second switching element and having a first opening and a second opening;

a second insulating layer disposed over the first insulating layer;

a first metal layer disposed in the second insulating layer, wherein a part of the first metal layer extends downward through the first opening and is electrically connected to the source/drain electrode of the first switching element;

a second metal layer disposed in the second insulating layer, wherein a part of the second metal layer extends downward through the second opening and is electrically connected to the source/drain electrode of the second switching element;

a first metal pad disposed on the second insulating layer, wherein a first orthographic projection area of the first opening projected on the substrate is within a second orthographic projection area of the first metal pad projected on the substrate;

a second metal pad disposed on the second insulating layer, wherein a third orthographic projection area of the second opening projected on the substrate is within a fourth orthographic projection area of the second metal pad projected on the substrate, wherein an absorptivity of a material of the first metal pad and the second metal pad with respect to a laser is lower than an absorptivity of a material of the source/drain electrode of the first switching element and the source/drain electrode of the second switching element with respect to the laser;

a first light-emitting element and a second light-emitting element electrically connected to the first metal layer and the second metal layer, respectively; and a third metal pad disposed between the first light-emitting element and the first metal layer, wherein the third metal pad and the first metal pad comprise a same material, and the third metal pad is separated from the first metal pad.

2. The display device of claim 1, further comprising a fourth metal pad disposed between the second light-emitting element and the second metal layer, wherein the fourth metal pad and the second metal pad comprise a same material, and the fourth metal pad is separated from the second metal pad.

3. The display device of claim 1, wherein the second metal pad extends between the second light-emitting element and the second metal layer.

4. The display device of claim 1, wherein the material of the first metal pad and the second metal pad comprises aluminum, molybdenum, titanium, copper, indium, or alloys thereof, and the material of the source/drain electrode of the first switching element and the source/drain electrode of the second switching element comprises molybdenum, aluminum, titanium, copper, indium, or alloys thereof.

5. The display device of claim 1, wherein the second insulating layer has a third opening, the first metal pad is disposed in the third opening, and the first light-emitting element is electrically connected to the first metal layer through the first metal pad, and the first orthographic projection area of the first opening projected on the substrate is within a fifth orthographic projection area of the third opening projected on the substrate.

* * * * *